US008801146B2

United States Patent
Sung et al.

(10) Patent No.: US 8,801,146 B2
(45) Date of Patent: Aug. 12, 2014

(54) INKJET PRINT HEAD AND METHOD FOR MANUFACTURING THE SAME

(71) Applicant: Samsung Display Co. Ltd., Yongin (KR)

(72) Inventors: Woo-Yong Sung, Seoul (KR); A-Ram Lee, Hwaseong-si (KR); Tae-Woon Cha, Seoul (KR); Tae-Gyun Kim, Seoul (KR); Hyoung Sub Lee, Seoul (KR); Seung-Yeon Chae, Hwaseong-si (KR); Sang Gun Choi, Suwon-si (KR)

(73) Assignee: Samsung Display Co., Ltd., Yongin (KR)

( * ) Notice: Subject to any disclaimer, the term of this patent is extended or adjusted under 35 U.S.C. 154(b) by 119 days.

(21) Appl. No.: 13/653,912

(22) Filed: Oct. 17, 2012

(65) Prior Publication Data
US 2013/0335483 A1    Dec. 19, 2013

(30) Foreign Application Priority Data

Jun. 19, 2012  (KR) .......................... 10-2012-0065690

(51) Int. Cl.
*B41J 2/14*        (2006.01)

(52) U.S. Cl.
USPC .................................. 347/45; 347/50; 347/64

(58) Field of Classification Search
CPC .............. B41J 2/14; B41J 2/162; B41J 2/135; B41J 2/175; B41J 2/17526; B41J 2/3351; B41J 2/3353

USPC .............................. 347/44–47, 50, 58, 59, 64
See application file for complete search history.

(56) References Cited

U.S. PATENT DOCUMENTS

2005/0190232  A1*  9/2005  Lee et al. ........................ 347/45
2007/0064057  A1*  3/2007  Silverbrook et al. ........... 347/59

FOREIGN PATENT DOCUMENTS

| JP | 2002-160364 | 6/2002 |
| JP | 2008-235654 | 10/2008 |
| KR | 10-2005-0121145 | 12/2005 |

\* cited by examiner

*Primary Examiner* — Thinh Nguyen
(74) *Attorney, Agent, or Firm* — H.C. Park & Associates, PLC

(57) ABSTRACT

An inkjet print head includes a jet assembly which includes a nozzle plate, the nozzle plate including an ink transferring path on a bottom surface of the nozzle plate, and a jet jetting a transferred ink out of the head. A printed circuit substrate is connected to the jet assembly and includes an integrated circuit and a connection electrode. A barrier coating layer covers a surface of the printed circuit substrate and an inner surface and an outer surface of the jet assembly except a bottom surface of the nozzle plate and a surface of the connection electrode of the jet assembly and the printed circuit substrate being connected with each other. The barrier coating layer has a layered structure which includes a flexible layer, a diffusion barrier layer, and a hydrophobic layer.

23 Claims, 15 Drawing Sheets ically an ink

INKJET PRINT HEAD AND METHOD FOR MANUFACTURING THE SAME

CROSS-REFERENCE TO RELATED APPLICATION

This application claims priority from and the benefit of Korean Patent Application No. 10-2012-0065690, filed on Jun. 19, 2012, which is hereby incorporated by reference for all purposes as if fully set forth herein.

BACKGROUND

1. Field

Exemplary embodiments of the present invention relate to an inkjet print head and a method for manufacturing the inkjet print head. More particularly, exemplary embodiments of the present invention relate to an inkjet print head included in an industrial inkjet printer and a method for manufacturing the inkjet print head.

2. Discussion of the Background

Generally, an inkjet print head is a structure that converts an electrical signal to a physical force to propel droplets of ink through small nozzles. The inkjet print head may be classified into different kinds according to a jet method. Particularly, a piezoelectric inkjet print head, which jets an ink by using a piezoelectric principle, has recently been extensively used in an industrial inkjet print head. For example, the inkjet print head is widely used for jetting an ink, which is melted from gold, silver and the like, on a flexible printed circuit substrate (FPCB) to form a circuit pattern, and for forming a liquid crystal, which is used in an industrial graphic or LCD component, or manufacturing an OLED or a solar cell, and the like.

Each nozzle of the inkjet print head has an ink path, and ink supplied along each ink path is jetted as a droplet from each nozzle. When using the inkjet print head, a jetted ink may be contaminated by a portion of ink absorbed in the inkjet print head during movement of the inkjet print head, or a material, which is used in forming the inkjet print head, may drop off of the head structure itself.

SUMMARY OF THE INVENTION

Exemplary embodiments of the present invention provide a durable inkjet print head which reduces contamination of the ink.

Exemplary embodiments of the present invention also provide a method of manufacturing the inkjet print head.

Additional features of the invention will be set forth in the description which follows, and in part will be apparent from the description, or may be learned by practice of the invention.

An exemplary embodiment of the present invention discloses an inkjet print head is including a jet assembly including a nozzle plate, the nozzle plate including an ink transferring-path and a jet, the ink transferring-path being disposed in the nozzle plate and the jet being disposed on a bottom surface of the nozzle plate. The transferred ink is jetted through the jet, a printed circuit substrate is connected to the jet assembly, and the printed circuit substrate includes an integrated-circuit and a connection electrode. A barrier coating layer is formed on the jet assembly, and the printed circuit substrate is combined with the jet assembly to cover a surface of the printed circuit substrate and an inner surface and an outer surface of the jet assembly except the bottom surface of the nozzle plate and a surface of the connection electrode, in which the barrier coating layer includes a flexible layer, a diffusion barrier layer and a hydrophobic layer that are sequentially stacked.

An exemplary embodiment of the present invention discloses a method of manufacturing an inkjet print head, in which a print head assembly is formed, the print head assembly being connected to a jet assembly and a printed circuit substrate. A first mask pattern covering a connection electrode of the printed circuit substrate is formed. A flexible layer is formed on an inner surface and an outer surface of the print head assembly having the first mask pattern. A diffusion barrier layer is formed on the flexible layer. A second mask pattern covering a bottom surface of a nozzle plate of the jet assembly is formed. A hydrophobic layer is formed on the diffusion barrier layer and the second mask pattern. The first and the second mask patterns are removed to form a barrier coating layer on the inner surface and the outer surface of the print head assembly, the barrier coating layer including the flexible layer, the diffusion barrier layer, and the hydrophobic layer.

It is to be understood that both the foregoing general description and the following detailed description are exemplary and explanatory and are intended to provide further is explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1A:
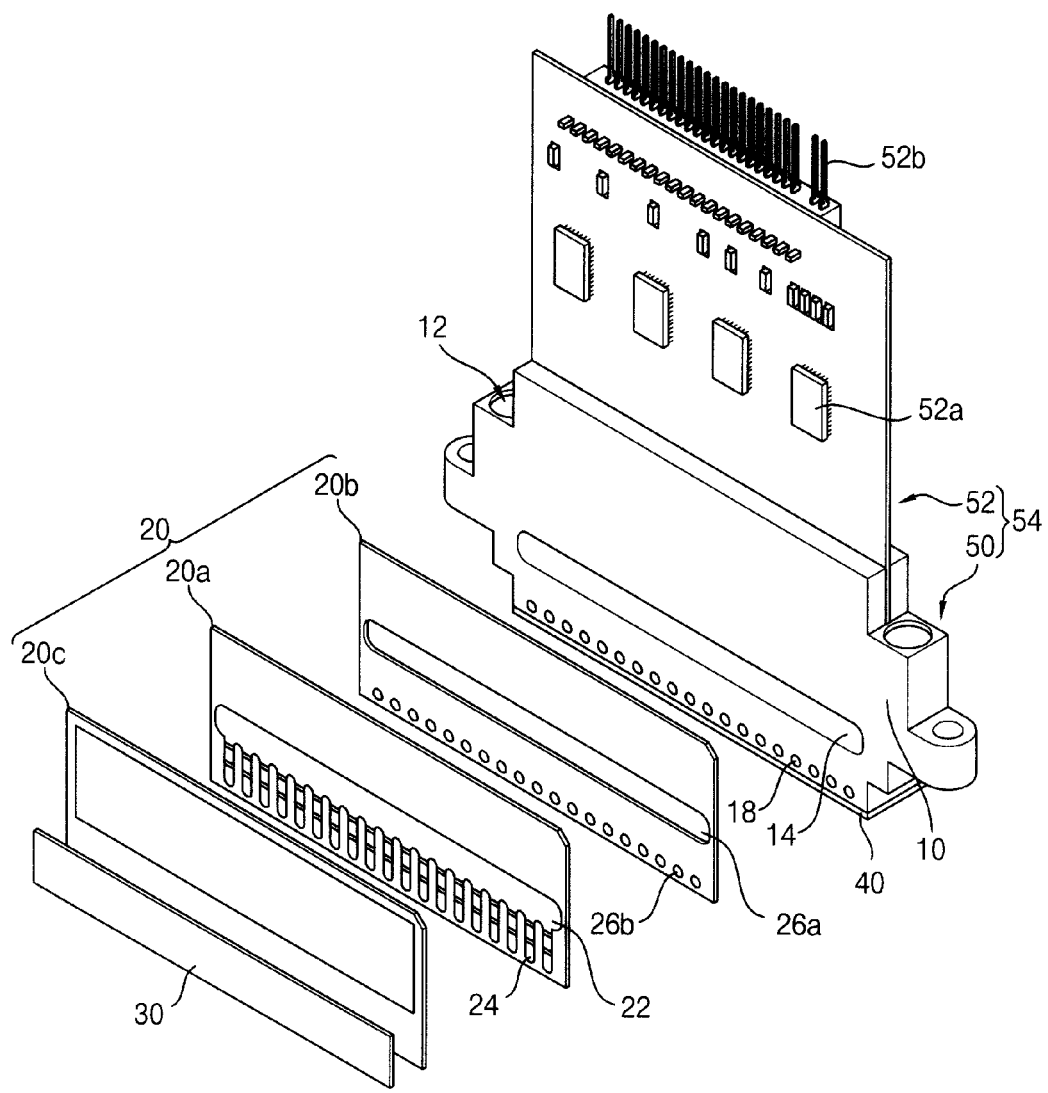
FIG. 1A is a schematic view illustrating an inkjet print head according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, Z (e.g., XYZ, XYY, YZ, ZZ).

Figure 1B:
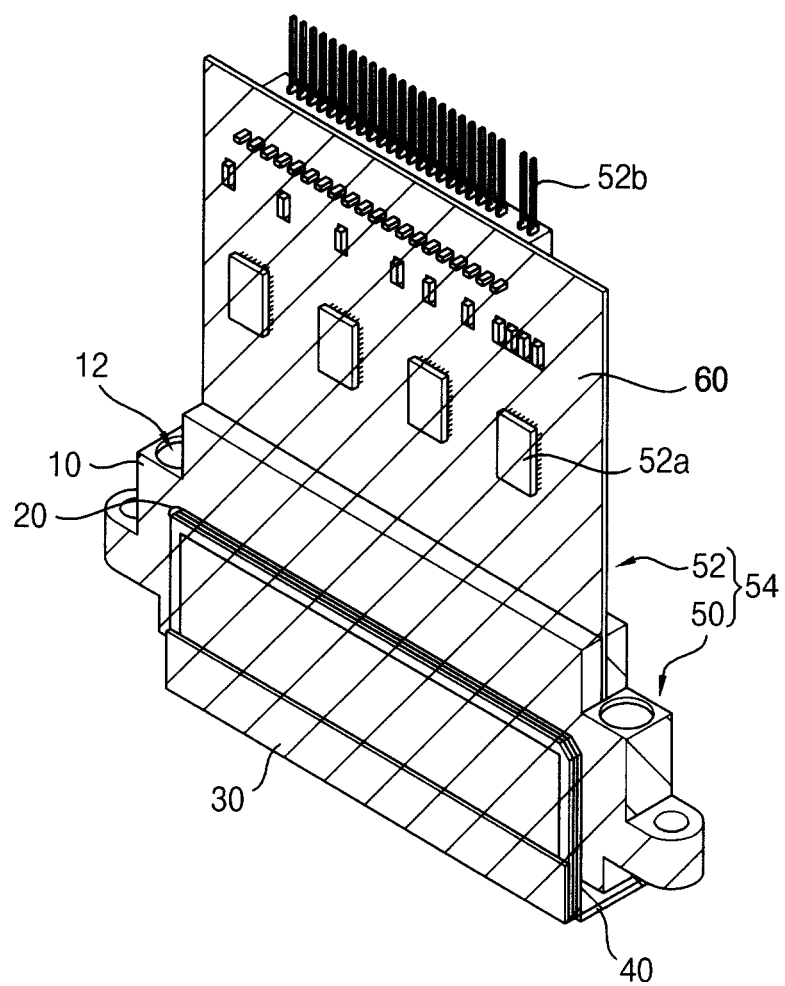
FIG. 1B is a perspective view illustrating an inkjet print head according to an exemplary embodiment of the present invention.
Figure 2A:
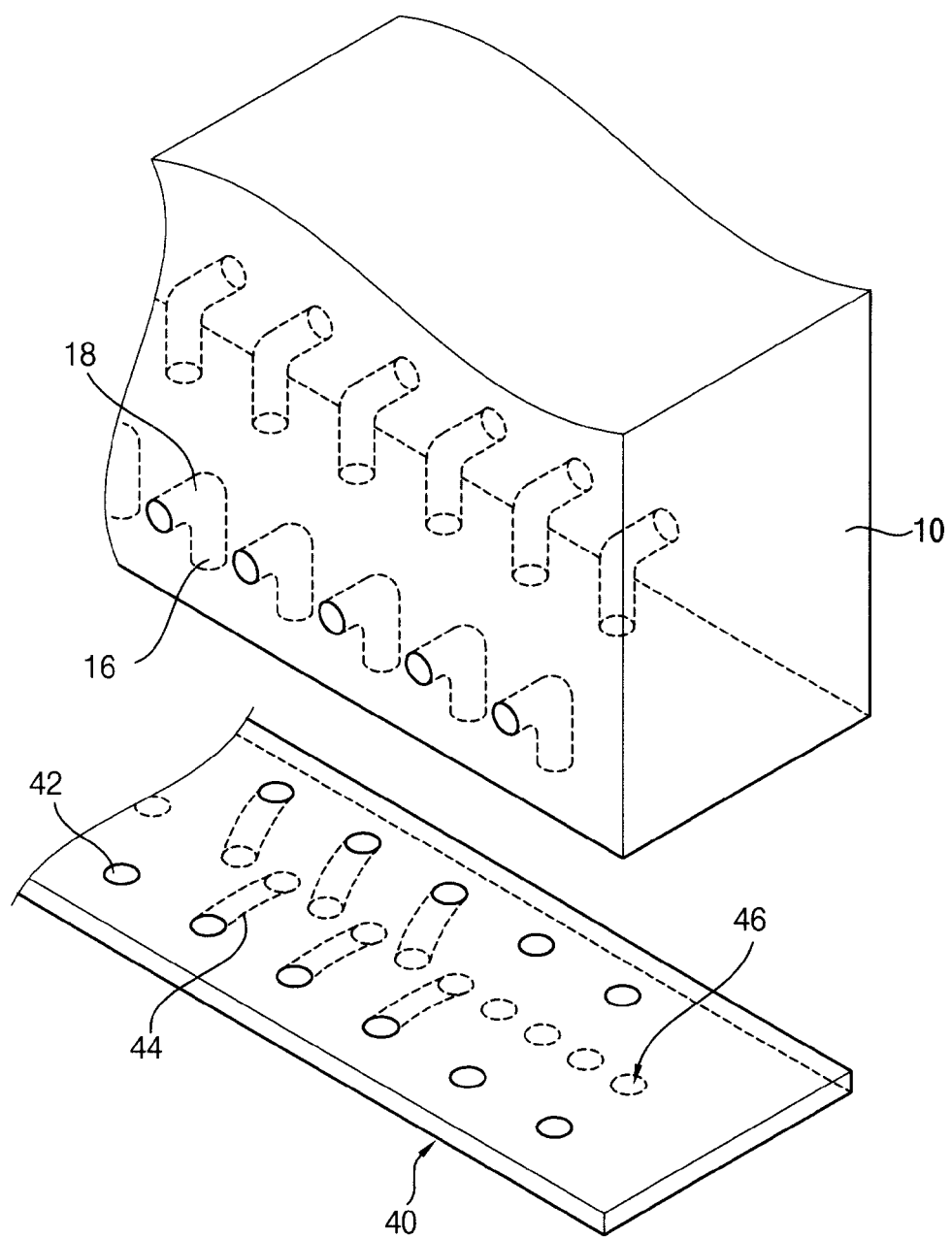
FIG. 2A is a schematic view illustrating a portion of the inkjet print head illustrated in FIG. 1A.
Figure 2B:
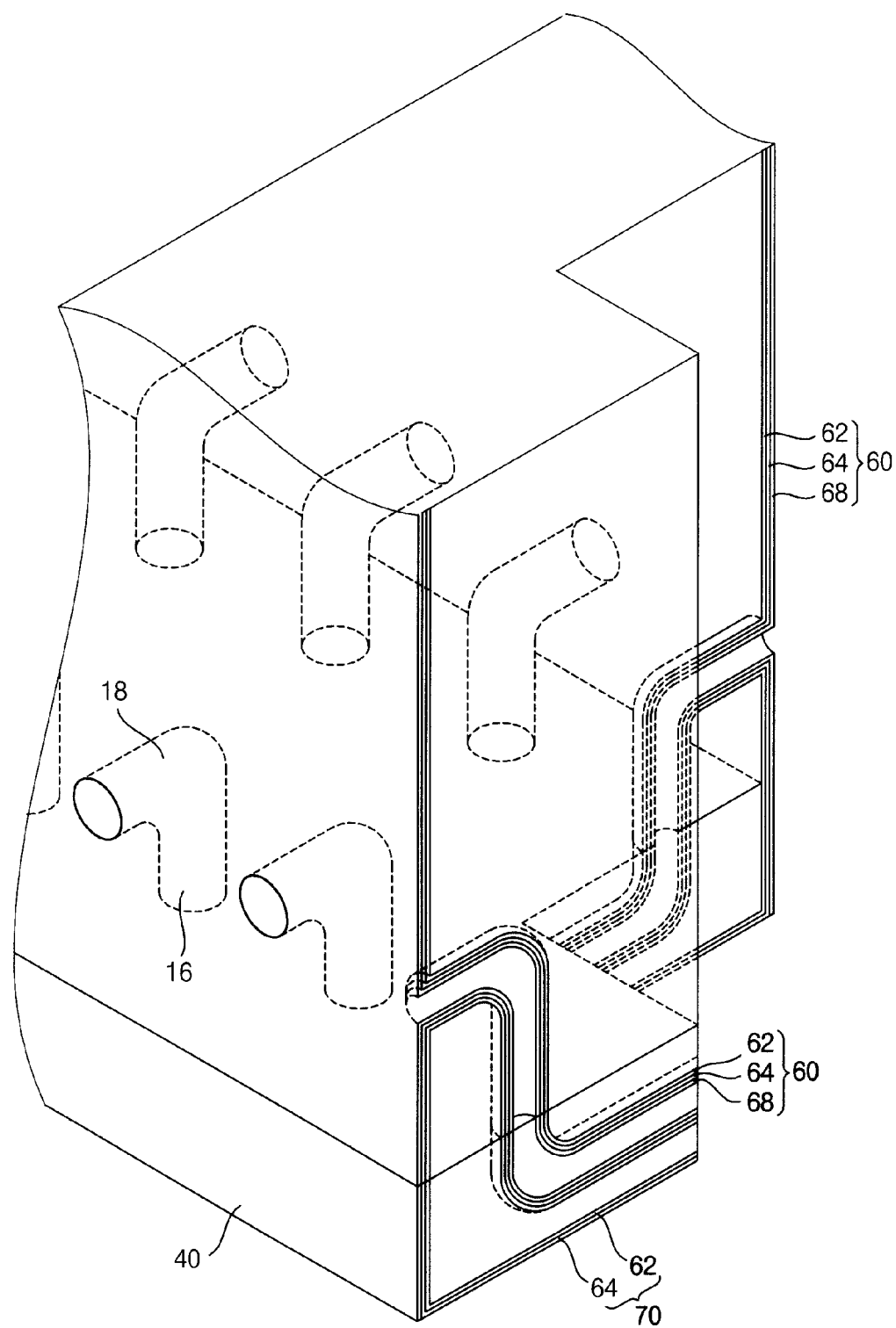
FIG. 2B is a cut-away perspective view illustrating a portion of the inkjet print head illustrated FIG. 1B.

FIG. 1A is a schematic view illustrating an inkjet print head according to an exemplary embodiment of the present invention. FIG. 1B is a perspective view illustrating an inkjet print head according to an exemplary embodiment of the present invention. FIG. 2A is a schematic view illustrating a part of the inkjet print head illustrated in FIG. 1A. FIG. 2B is a cut-away perspective view illustrating a part of the inkjet print head illustrated FIG. 1B.

First and second barrier coating layers 60, 70 are not illustrated in FIG. 1A and FIG. 2A.

According to FIG. 1A to FIG. 2B, an inkjet print head includes a print head assembly 54, which includes a jet assembly 50 connected to a printed circuit substrate 52, and first and second barrier coating layers 60, 70, which are disposed on inner and outer surfaces of the print head assembly 54. An ink which is used in an inkjet print head may include a liquid crystal which is used in a liquid crystal display device (not shown).

The jet assembly 50 includes a body part 10, a common plate assembly 20 attached to both sides of the body part 10, a nozzle plate 40 disposed on a bottom surface of the body part 10, and a piezoelectric component 30. The printed circuit substrate 52 includes an integrated circuit 52a and a connection electrode 52b.

The body part 10 of the jet assembly 50 is manufactured with carbon or silicon. The body part 10 may have an elongated shape, and may include an ink inlet 12 disposed on a side surface of each end of the body part 10. Ink flows through the ink inlet 12. An ink charging path 14 containing an ink which has flowed through the ink inlet 12 is disposed in the body part 10. The ink charging path 14 may have a long tubular shape extended in a longitudinal direction of the body part 10.

According to FIG. 2A and FIG. 2B, more than 200 of first openings 16, for example, 256 of first openings 16, may be disposed on a bottom surface of the body part 10. The first openings 16 may be disposed in a longitudinal direction of the body part 10 in one or more rows. The first openings 16 may each be connected to each ink path 18. The ink paths 18 extend toward two separate sides of the body part 10.

The common plate assembly 20 may be disposed on each front and back wall of is body part 10 so that there may be two (2) common plate assemblies 20. In FIG. 1A, only a common plate assembly 20 of a front wall of a body part is illustrated.

The common plate assembly 20 is a component which forms an ink transferring-path. The ink transferring-path provides ink from the ink charging path 14 of the body part 10 to first openings 16 of a bottom surface of the body part 10. The common plate assembly 20 may include a common plate 20a, a reinforcing plate 20b adhering to a plane of each common plate 20a, and a polymer film 20c adhering to another plane of the common plate 20a.

The common plate 20a includes a first cavity 22 and plurality of second cavities 24. The first cavity 22 extends in a longitudinal direction which faces the ink charging path 14, and the second cavities 24 are connected to the first cavity 22 to extend in a direction perpendicular to the orientation of the first cavity 22. The size of the first cavity 22 and the relative position of the first cavity 22 for the common plate 20a are substantially identical with the size and the relative position of the ink charging path 14 of the body part 10. Furthermore, an end of the second cavity 24 is closed, and the end may face an ink path of the side surface 18 of the body part 10 to connect to the ink path of the side surface 18.

The reinforcing plate 20b is disposed between the common plate 20a and the body part 10. The reinforcing plate 20b includes a third cavity 26a extending in a longitudinal direction of the common plate 20a, and a hole 26b facing an end of each of the second cavities 24.

Furthermore, the polymer film 20c covers a plane of the common plate 20a. The polymer film 20c is flexible so as to prevent transforming shapes of components by a piezoelectric component 30. An example of a material for the polymer film 20c may include polyimide.

According to the above, the common plate assembly 20 is assembled with a common plate 20a, a reinforcing plate 20b, and a polymer film 20c. The common plate assembly 20 includes the first to the third cavities 22, 24, 26b, and each of the first to the third cavities 22, 24, 26b functions as an ink transferring path. Therefore, ink contained in the ink charging path 14 flows again into the ink path 18 of a side surface of the body part 10 through the third cavity 26a, the first cavity 22a, the second cavity 24, and the hole 26b. Furthermore, the ink is jetted by the first openings 16 on a bottom surface the body part 10 through the ink path 18.

The piezoelectric component 30 adheres to a side surface of the common plate assembly 20. For example, the piezoelectric component 30 adheres to an outer surface of the polymer film 20c. The piezoelectric component 30 may be disposed on both front and back side surfaces of the body part 10. The piezoelectric component 30 pumps ink transferred through an ink transferring path of the common plate assembly 20.

The nozzle plate 40 may adhere to a bottom surface the body part 10. The nozzle plate 40 may include silicon. The upper surface of the nozzle plate 40, which is a plane adhering to the body part 10, includes second openings 42 facing the first openings 16 to connect to the first openings 16. Furthermore, channels 44 connected to the second openings 42 are disposed on the upper surface of the nozzle plate 40, so that an ink is transferred through the channels 44. The channels are connected to each second opening 42, and only a part of the channel 42 is illustrated.

Jets 46 are connected to the channels 44 and connected to the bottom surface the nozzle plate 40. An ink is jetted through the jets 46.

According to FIG. 1B, each of the components of the jet assembly 50 is adhered by using epoxy. Therefore, although not illustrated, the epoxy resins may be exposed at the end of the each adhering part.

The first barrier coating layer 60 (represented by a hatched part of FIG. 1B) prevents an ink or a particle from flowing into a micropore of the inner surface of the jet assembly 50, and the first barrier coating layer 60 is provided to improve the durability of the jet assembly 50 and the printed circuit substrate 52.

The first barrier coating layer 60 covers an entire inner surface and an outer surface of the print head assembly 54, which is assembled with the jet assembly 50 and a printed circuit substrate 52, except a bottom surface of the nozzle plate 40 and a common electrode 52b part of a printed circuit substrate 52.

Hereinafter, a layered structure of the first barrier coating layer 60 will be explained in detail.

Figure 3A:
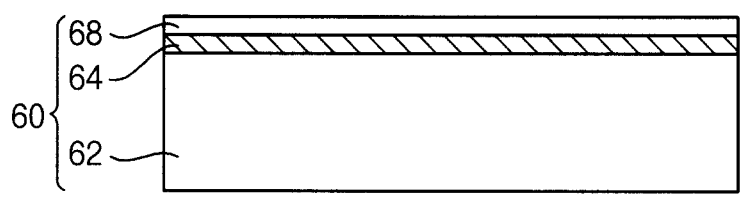
FIG. 3A is a cross-sectional view illustrating a layered structure of a first barrier coating layer illustrated in FIG. 1B.
Figure 3B:
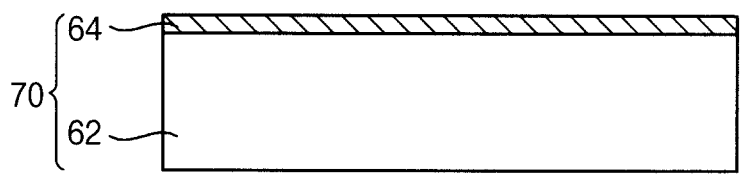
FIG. 3B is a cross-sectional view illustrating a layered structure of a second barrier coating layer illustrated in FIG. 1B.

FIG. 3A is a cross-sectional view illustrating a layered structure of a first barrier coating layer illustrate in FIG. 1B. FIG. 3B is a cross-sectional view illustrating a layered structure of a second barrier coating layer illustrate in FIG. 1B.

Referring to FIG. 3A, the first barrier coating layer 60 may include a layered structure which includes thin layers. For example, the first barrier coating layer 60 may include a flexible layer 62, a diffusion barrier layer 64, and a hydrophobic layer 68, and these layers may be stacked. The top layer of the first barrier coating layer 60 may be the hydrophobic layer 68, which is exposed to the outside.

The flexible layer 62 is provided as the lowest layer of the print head assembly 54, and is directly connected to each component. The flexible layer 62 prevents transforming a shape of each component by a pressure which is generated in an ink jetting process and prevents cracking, so that the durability of the print head assembly 54 is improved. Furthermore, the flexible layer 62 permits a surface of each component to be flat.

The flexible layer 62 may include an organic layer. When the flexible layer 62 is formed, the flexible layer 62 may be formed from a material which may be formed at a low temperature for preventing a degradation of each of the component properties of the jet assembly 50 and the printed circuit substrate 52. For example, a material, which may be formed at a low temperature of 100° C. or less, may be used for preventing degradation of the components. Examples of the organic layer may include parylene. The parylene may include parylene C, parylene N, parylene D, parylene HF and the like.

The flexible layer 62 may be formed thicker than other layers of the first barrier coating layer 60 for maintaining the flexible property and the planarization property. When the flexible layer 62 has a thickness less than 0.1 μm, the flexible and planarization properties are not good. When the flexible layer 62 has a thickness greater than 10 μm, the entire thickness of the first barrier coating layer 60 is thick enough to reduce the width of the jet 46 and an inner ink path, so that such a thickness is not desirable. Therefore, a thickness of the flexible layer 62 may be in a range of 0.1 μm to 10 μm.

The diffusion barrier layer 64 is disposed on the flexible layer 62 and is used as a layer for preventing the diffusion of the ink which is diffused to a micropore (for example, a micropore of carbon surface) which is disposed in each component. The diffusion barrier layer 64 may be formed to have a higher density than the flexible layer 62 for preventing the diffusion of the ink. The diffusion barrier layer 64 may include an inorganic layer. The diffusion barrier layer 64 may be formed by an atomic layer deposition method.

When the diffusion barrier layer 64 is formed, the diffusion barrier layer 64 may is be formed from a material, which may be formed at a low temperature, for preventing a degradation of each of the component properties of the jet assembly 50 and the printed circuit substrate 52, so that the depositing of material at a low temperature of 100 degrees or less is used. The diffusion barrier layer 64 may include a metal oxide formed through an atomic deposition method. According to the previous description, the flexible layer 62 and the diffusion barrier layer 64 include an organic layer and an inorganic layer that are stacked.

The diffusion barrier layer 64 has a higher density than the flexible layer 62. Thus, when the diffusion barrier layer 64 is formed to be thick, the flexible property of the entire first barrier coating layer 60 is reduced. Therefore, the diffusion barrier layer 64 may be as thin as possible to still prevent the diffusion of ink. When the density of the diffusion barrier layer 64 is high, the diffusion barrier layer 64 may further impede the diffusion of ink, so that the diffusion barrier layer 64 may be thinner.

When a metal oxide of the diffusion barrier layer 64 is thinner than 10 Å, the effect of the diffusion prevention is reduced. When a metal oxide of the diffusion barrier layer 64 has a thickness greater than 500 Å, the flexible property may be reduced. Therefore, a thickness of the metal oxide may be greater than 10 Å and less than 500 Å.

The diffusion barrier layer 64 functions as an adhesion layer which improves the adhesive property between each layer. For example, the hydrophobic layer 68 formed on the diffusion barrier layer 64 has a high adhesive property because of the presence of the diffusion barrier layer 64.

The hydrophobic layer 68 includes a hydrophobic material which has a high contact angle which is greater than 90 degrees (for example, larger than 90 degrees and smaller than 130 degrees) with respect to water. The hydrophobic layer 68 may include a self-assembled is monolayer (SAM). Examples of the SAM may include a silane-based SAM, a thiol-based SAM, and the like.

The SAM may be formed through a vapor phase deposition method or a liquid phase deposition method at a low temperature of 100° C. or less. Furthermore, the SAM is chemically connected to the diffusion barrier layer 64, so that the adhesive property of the hydrophobic layer 68 is superior. Also, a thickness of SAM may be less than 100 Å. The hydrophobic layer 68 is the top layer exposed to the outside of the first barrier coating layer 60, so that ink which flows to an inkjet print head is directly connected to the hydrophobic layer 68 and the ink is transferred through the inner transfer path of the print head. Therefore, the ink may be jetted through a jet without being absorbed by each component.

Hereinafter, a region having the barrier coating layer 60 will be explained in detail.

Figure 4:
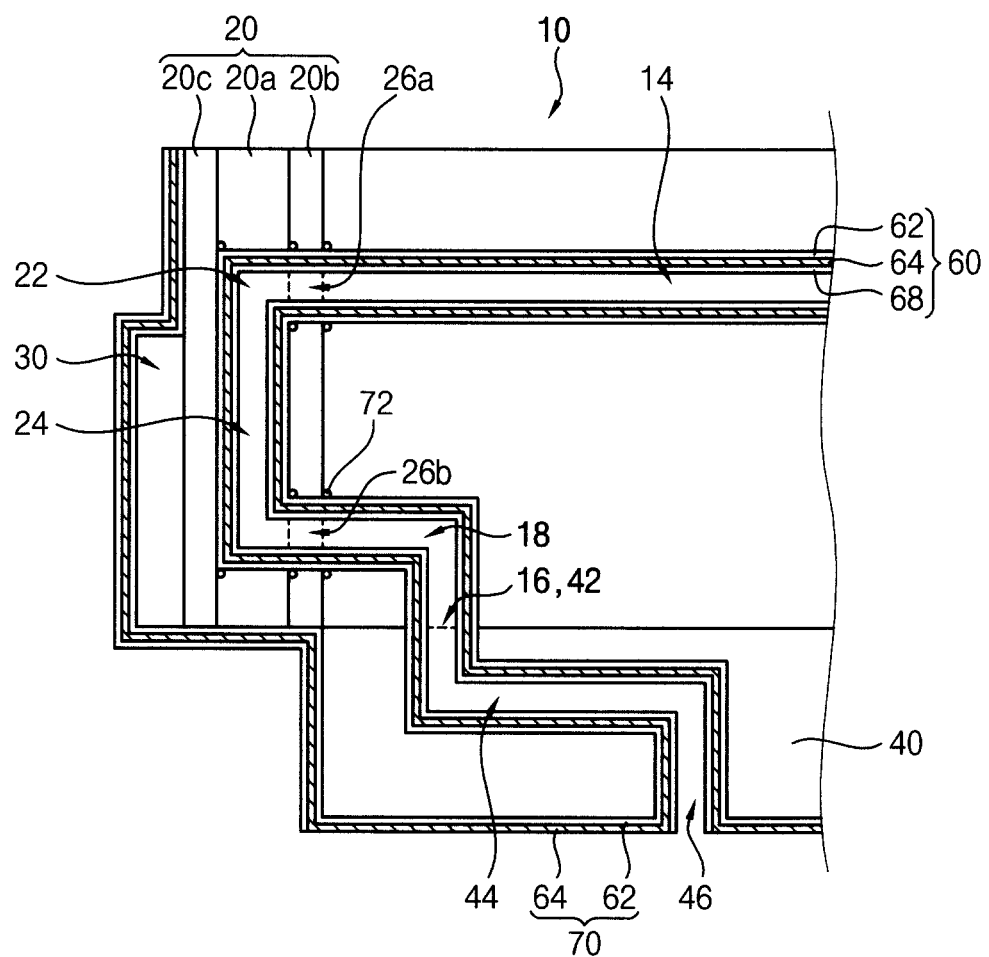
FIG. 4 is a cross-sectional view illustrating an ink transferring path and an area having a barrier coating layer in an inkjet print head illustrated in FIG. 1B.

FIG. 4 is a cross-sectional view illustrating an ink transferring-path and an area having first and second barrier coating layers 60, 70 in an inkjet print head illustrated in FIG. 1B.

Referring FIG. 4 and FIG. 2B, the first barrier coating layer 60 is disposed on an outer surface of the print head assembly 54, an inner side of an ink inlet 12 of the body part and an inner surface of an ink charging path 14. Furthermore, the first barrier coating layer 60 is disposed on ink transferring-paths, for example, the first barrier coating layer 60 is disposed on an inner surface of the first to the third cavities 22, 24 and 26a, a hole 26b, an ink path 18, the first and second openings 16, 42, a channel 44, and a jet 46 that are included in the body part 10.

The body part 10 may be formed by carbon or silicon. Generally, the body part 10 may be formed of carbon which is a suitable material to prevent the corrosion by an ink. However, carbon is a porous material having many micropores at its surface, and the application is of pressure to carbon may cause it to easily fracture or crumble. Therefore, carbon forming the body part 10 may be damaged in an ink jetting process, and carbon particles may flow and contaminate the ink. Furthermore, ink may be absorbed and flow into the micropores on the surface of the body part, and a jet normally capable of jetting ink may be clogged by the ink which is absorbed and solidified in the ink path, thereby preventing a jetting.

In the exemplary embodiment, the first barrier coating layer 60 is disposed on an inner surface and an outer surface of the body part 10, and covers a micropore of a surface of the body part 10. Therefore, the absorption and inflow of the ink to micropore of a surface of the body part 10 is prevented and the contamination is reduced. Furthermore, the ink is not directly connected to carbon of the body part 10 and connected to a surface of the first barrier coating layer 60 while the ink moves. Therefore, inflow of a carbon particle to jetted ink is reduced.

The first barrier coating layer 60 is disposed on an outer surface of a common plate assembly 20 and a surface of inner transfer paths 22, 24, 26a, and 26b. For example, the first barrier coating layer 60 is disposed on an inner surface of a first cavity 22 and an inner surface of a second cavity 24 of the common plate and an inner surface of a third cavity 26a of the reinforcing plate 20b and a hole 26b. Therefore, a contamination of ink by detachment of the materials of the common plate assembly (for example, a metal) may be reduced.

The first barrier coating layer 60 is disposed on an outer surface of the piezoelectric component 30.

The first barrier coating layer 60 is disposed on each of an inner surface of second openings 42 of the nozzle plate 40 and an inner surface of a channel 44 connected to the second openings 42.

Alternatively, the first barrier coating layer 60 is not formed on a bottom of the is nozzle plate 40. When the first barrier coating layer 60 is formed on a bottom surface the nozzle plate 40, the nozzle plate 40 has a high hydrophobic property as a result of hydrophobic layer 68, which is the top layer of the first barrier coating layer 60. Therefore, ink is not jetted by a jet 46 of the nozzle plate 40, and the ink remains at a bottom surface of the nozzle plate 40.

The first barrier coating layer 60 is disposed on an entire printed circuit substrate 52, as shown in FIG. 1A and FIG. 1B, except for a region having a connecting electrode 52B being connected to the outside. The first barrier coating layer 60 may be provided as a protective layer which protects the printed circuit substrate 52. Furthermore, the first barrier coating layer 60 is not coated on the connecting electrode 52B having a conductive property.

The first barrier coating layer 60 is formed to cover an upper surface of epoxy resin 72 connected to each component of the jet assembly 50. The epoxy resin 72 may be disposed on a peripheral portion of the connecting region of each component. The epoxy is not directly connected to ink by the first barrier coating layer 60. Therefore, contamination of ink caused by break-up of the epoxy resin 72 to an ink jetting process is reduced.

The second barrier coating layer 70 may be disposed on a bottom of the nozzle plate 40. The second barrier coating layer 70 has a structure which is substantially identical with the first barrier-coating layer 60 except that at least of the hydrophobic layer 68, which is the top layer, is removed. Therefore, the second barrier coating layer 70 does not include SAM.

For example, the second barrier coating layer 70 may be a single layer of a flexible layer 62 or a diffusion barrier layer 64. In another example, according to FIG. 3B and FIG. 4, the second barrier coating layer 70 may include a flexible layer 62 and a diffusion barrier layer 64 that are stacked. According to the description above, the nozzle plate 40 does not have a strong hydrophobic property because a hydrophobic layer 68 is not included on a bottom surface is of the nozzle plate 40. Therefore, failure of the ink to be jetted may be prevented. Alternatively, the second barrier coating layer 70 may be omitted, because, the second barrier coating layer 70 may be selectively disposed. For example, a coating layer may be not formed on a bottom surface of the nozzle plate 40.

According to above, an inkjet print head according to the exemplary embodiment includes first and second barrier coating layers 60, 70 disposed on an inner surface and an outer surface of the print head assembly 54.

Although the exemplary embodiments described above discuss a structure of the print head assembly 54, the structure of the print head assembly 54 could also include any other print head assembly 54 of an ink jetting method.

An inkjet print head according to the exemplary embodiment has high durability because of the presence of the first and second barrier coating layers 60, 70. Furthermore, the contamination of ink may be suppressed.

Figure 5:
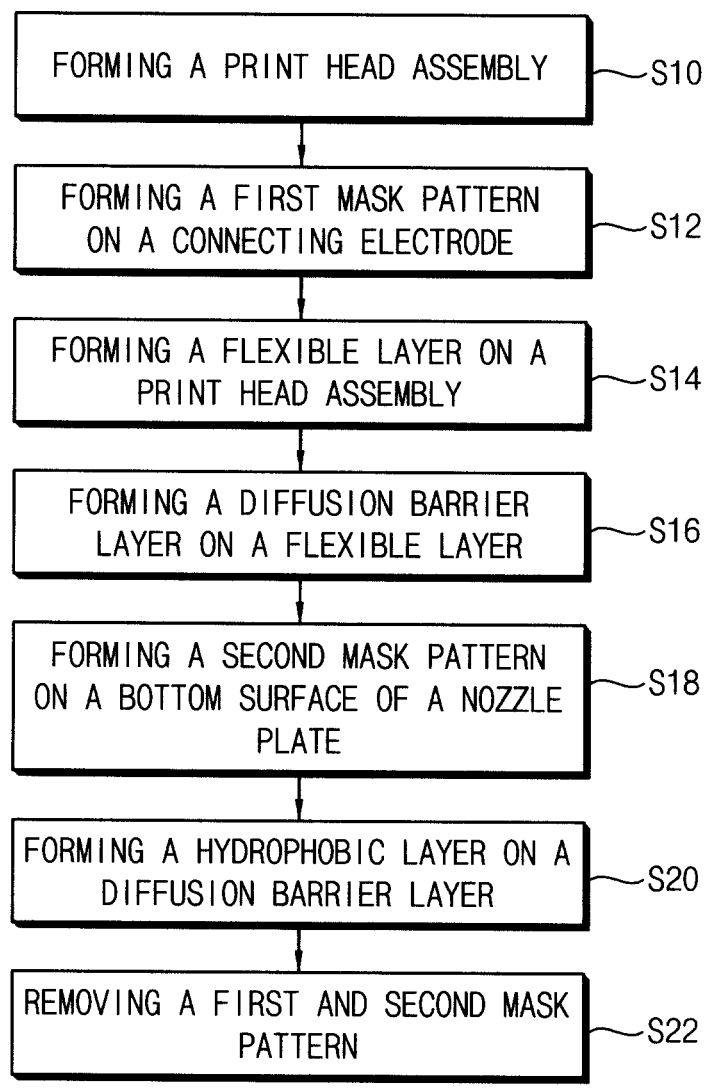
FIG. 5 is a flowchart showing steps in a method of manufacturing a print head according to a first exemplary embodiment of the present invention.

FIG. 5 is a flowchart describing a method of manufacturing a print head according to a first exemplary embodiment of the present invention.

The print head assembly 54 is formed in step S10. The print head assembly 54 is defined as a state in which each component of the print head is completely assembled. For example, a jet assembly 50 including a body part 10, a common plate assembly 20, a nozzle plate 40, and a piezoelectric component 30 are connected to a printed circuit substrate 52 including an integrated circuit 52*a* and a connecting electrode 52*b*.

A first mask pattern is formed on a connecting electrode 52*b* of a printed circuit substrate 52 in step S12. The first mask pattern is provided to prevent formation of first and second barrier coating layers 60, 70 on the connecting electrode 52*b*.

A flexible layer 62 is formed on the print head assembly 54 step S14. The flexible layer 62 may be formed on an inner surface and an outer surface of the print head assembly 54 including the nozzle plate 40 besides a connecting electrode 52*b* of the printed circuit substrate 52. Therefore, the flexible layer 62 is formed on not only an outer surface of the print head but also on a surface of an ink path of the print head.

The flexible layer 62 may be formed of an organic layer. The flexible layer 62 may be formed by a liquid phase deposition method or a vapor phase deposition method at a temperature of 100° C. or less. For example, the flexible layer 62 may be formed at a temperature in a range of 10° C. to 100° C.

The flexible layer 62 may be formed to have a greater thickness than other layers of a first barrier coating layer 60 for maintaining the flexible property and the planarization property. According to the previous description, the flexible layer 62 is formed to have a thickness in a range of 0.1 μm to 10 μm. The material forming the flexible layer 62 may include different kinds of parylene, such as parylene C, parylene N, parylene D, parylene HF, and the like.

A diffusion barrier layer 64 is formed on the flexible layer 62 step S16. The diffusion barrier layer 64 may be an inorganic layer formed by an atomic layer deposition method at low temperature of 100° C. or less. For example, the diffusion barrier layer 64 may be formed at a temperature in a range of 10° C. to 100° C.

The diffusion barrier layer 64 may include a metal oxide. Examples of the metal oxide include an aluminum oxide, a hafnium oxide, an aluminum silicon oxide, a hafnium silicon oxide, and the like. A thickness of the metal oxide may be greater than 10 Å and less than 500 Å.

A second mask pattern is formed on the nozzle plate 40 in the print head assembly 54 step S18. The second mask pattern is provided to prevent forming a hydrophobic layer 68 at a bottom surface of the nozzle plate 40.

A hydrophobic layer 68 is formed on the diffusion barrier layer 64 and a second mask pattern step S20. The hydrophobic layer 68 may be formed on an inner surface and an outer surface of the print head assembly 54 other than on a connecting electrode 52*b* of the printed circuit substrate 52 and a bottom surface of the nozzle plate 40.

The hydrophobic layer 68 includes a hydrophobic material which has a high contact angle of more than 90 degrees with respect to water. The hydrophobic layer 68 is formed by depositing a self-assembled monolayer through a vapor phase deposition method or a liquid phase deposition method. Examples of SAM include a silane-based SAM and a thiol-base SAM. The SAM may have a small thickness less than 100 Å. The hydrophobic layer 68 may be formed at a low temperature of 100° C. or less. For example, the hydrophobic layer 68 may be formed at a temperature in a range of 10° C. to 100° C.

The first and the second mask patterns are removed at step S22. Therefore, a flexible layer 62, diffusion barrier layer 64, and a hydrophobic layer 68 formed on the first mask pattern are also removed. Furthermore, hydrophobic layers 68 formed on the second mask pattern are removed.

By this process, the first barrier coating layer 60 is formed on an inner surface and an outer surface of a print head assembly 54 except for a connecting electrode 52*b* of the printed circuit substrate 52 and a bottom surface of the nozzle plate 40. Furthermore, a second barrier coating layer 70, which does not have a hydrophobic layer, is formed on the bottom surface of the nozzle plate 40.

Therefore, because the first and second barrier coating layers 60, 70 are formed in the inkjet print head, the inkjet print head has high durability. Furthermore, the contamination of ink is suppressed, as is the contamination of ink caused by the presence of carbon particles from a body part and epoxy, which is an adhesion component in an ink jetting process.

An inkjet print head according to the exemplary embodiment includes a first barrier coating layer 60, and the first barrier coating layer 60 has a layered structure sequentially having a flexible layer 62, a diffusion barrier layer 64, and a hydrophobic layer 68. Although the above exemplary embodiment discussed the diffusion barrier layer 64, the diffusion barrier layer 64 could also be created by various layers. Furthermore, the diffusion barrier layer 64 may include only a single layer, but more than two different materials may also be stacked to form the diffusion barrier layer 64. Furthermore, one or more than two diffusion barrier layers 64 may be additionally disposed on a lower portion of the flexible layer 62.

Therefore, the first barrier coating layer 60 may have varied layered structures, so that various exemplary embodiments, each having a different layered structure, may be presented.

Hereinafter, additional exemplary embodiments according to the present invention will be described. Each component of the print head assembly 54 of the exemplary embodiments may be substantially identical with components according to a first exemplary embodiment. Furthermore, an area having the first and the second barrier coating layers 60, 70 may be substantially identical with an area according to the first exemplary embodiment. However, first and a second barrier coating layers 60, 70 coated on an inkjet print head according to each of the additional exemplary embodiments has a different layered structure from the first exemplary embodiment. Therefore, each component of the print head assembly 54 which is is described in the FIG. 1 will be omitted, and a layered structure of first and second barrier coating layers 60, 70 will be described in detail.

Figure 6A:
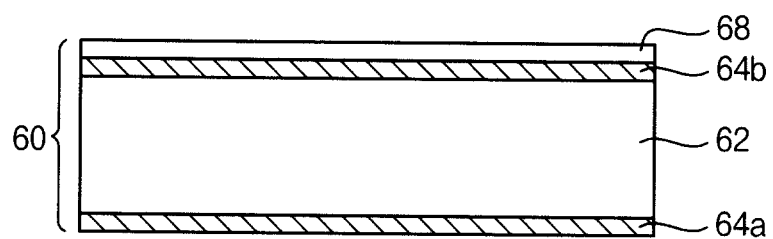
FIG. 6A is a cross-sectional view illustrating a layered structure of a first barrier coating layer of an inkjet print head according to a second exemplary embodiment of the present invention.
Figure 6B:
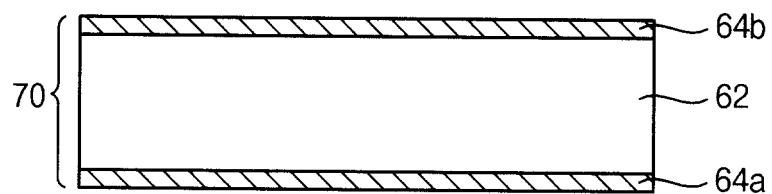
FIG. 6B is a cross-sectional view illustrating a layered structure of a second barrier coating layer of an inkjet print head according to a second exemplary embodiment of the present invention.

FIG. 6A is a cross-sectional view illustrating a layered structure of a first barrier coating layer 60 of an inkjet print head according to a second exemplary embodiment of the present invention. FIG. 6B is a cross-sectional view illustrating a layered structure of a second barrier coating layer 70 of an inkjet print head according to a second exemplary embodiment of the present invention.

According to FIG. 6A, the first barrier coating layer 60 may include a first diffusion barrier layer 64*a*, a flexible layer 62, a second diffusion barrier layer 64b, and a hydrophobic layer 68, and the first diffusion barrier layer 64a, the flexible layer 62, the second diffusion barrier layer 64b and the hydrophobic layer 68 may be stacked. A first barrier coating layer 60 according to the exemplary embodiment is substantially identical with a first barrier coating layer 60 according to a first exemplary embodiment except that the first barrier coating layer 60 according to the second exemplary embodiment further includes a first diffusion barrier layer 64a.

The first diffusion barrier layer 64a is the lowest layer connected to an inner and outer surface of the print head assembly 54. The inclusion of the first diffusion barrier layer 64a prevents an inflow of ink through a micropore by diffusing the ink toward an inner surface during a jetting process. Furthermore, the inclusion of the first diffusion barrier layer 64a improves the adhesive property of a flexible layer 62. The first diffusion barrier layer 64a may include an inorganic layer.

In the exemplary embodiment, the first diffusion barrier layer 64a may include a metal oxide formed through an atomic layer deposition method. Examples of the metal oxide is include an aluminum oxide, a hafnium oxide, an aluminum silicon oxide, a hafnium silicon oxide, and the like. A metal oxide provided as the first diffusion barrier layer may have a thickness greater than 10 Å and less than 500 Å.

A flexible layer 62, a second diffusion barrier layer 64b, and a hydrophobic layer 68 formed on the first diffusion barrier layer 64a may be substantially identical with a first barrier coating layer 60 according to a first exemplary embodiment. The first and the second diffusion barrier layers 64a, 64b, including an inorganic layer, are connected to a flexible layer 62 including an organic layer to be a multiple layer which has a inorganic layer/organic layer/inorganic layered structure.

Selectively, a second barrier coating layer 70 may be disposed on a bottom surface of the nozzle plate 40. The second barrier coating layer 70 may have a structure in which at least a hydrophobic layer 68, which is the top layer of the first barrier coating layer 60, is removed. For example, the second barrier coating layer 70 does not include SAM. For example, according to FIG. 6B, the second barrier coating layer 70 includes a first diffusion barrier layer 64a, a flexible layer 62 and a second diffusion barrier layer 64b that are stacked.

A method of manufacturing an inkjet print head according to the second exemplary embodiment will be simply described.

A first mask pattern is formed on a connecting electrode 52b of a print head assembly 54. The first mask pattern is provided to form coating layers on the connecting electrode 52b.

A metal oxide is formed by an atomic layer deposition method to form a first diffusion barrier layer 64a on the print head assembly 54. The first diffusion barrier layer 64a may have a thickness greater than 10 Å and less than 500 Å.

After the above, a process which is substantially identical with step S12 to step S22 described in FIG. 5A is used to manufacture an inkjet print head including first and second barrier coating layers 60, 70, as illustrated in FIG. 6A and FIG. 6B.

Figure 7A:
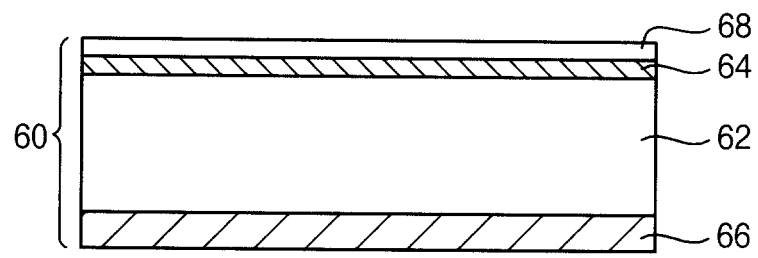
FIG. 7A is a cross-sectional view illustrating a layered structure of a first barrier coating layer of an inkjet print head according to a third exemplary embodiment of the present invention.
Figure 7B:
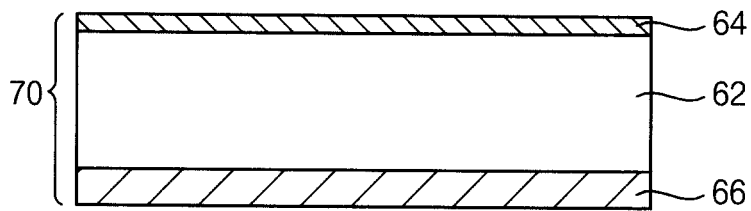
FIG. 7B is a cross-sectional view illustrating a layered structure of a second barrier coating layer of an inkjet print head according to a third exemplary embodiment of the present invention.

FIG. 7A is a cross-sectional view illustrating a layered structure of a first barrier coating layer 60 of an inkjet print head according to a third exemplary embodiment of the present invention. FIG. 7B is a cross-sectional view illustrating a layered structure of a second barrier coating layer 70 of an inkjet print head according to a third exemplary embodiment of the present invention.

According to FIG. 7A, a first barrier coating layer 60 includes a first diffusion barrier layer 66, a flexible layer 62, a second diffusion barrier layer 64, and a hydrophobic layer 68, and the first diffusion barrier layer 66, the flexible layer 62, the second diffusion barrier layer 64, and the hydrophobic layer 68 may be stacked.

The first diffusion barrier layer 66 may be the lowest layer which is directly connected to an inner surface and an outer surface of the print head assembly 54. The adhesive property of the flexible layer 62, which is disposed on the first diffusion barrier layer 66, may be improved by the presence of the first diffusion barrier layer 66.

The first diffusion barrier layer 66 according to the exemplary embodiment may include a different material and use a different method from a diffusion barrier layer according to a first exemplary embodiment.

The first diffusion barrier layer 66 may include an inorganic layer formed by a chemical vapor deposition method. The first diffusion barrier layer 66 is connected to a flexible layer 62 including an organic layer, so that the first diffusion barrier layer 66 has a multi-layered structure.

When the first diffusion barrier layer 66 is formed, none of the properties of the components is changed, so that the first diffusion barrier layer 66 may use a material which may be formed at a low temperature of 100° C. or less. The first diffusion barrier layer 66 may include silicon oxide formed by a chemical vapor deposition method. When the diffusion barrier layer 66 has a large thickness, flexibility is reduced, so that the first diffusion barrier layer 66 may have a reduced thickness.

When the first diffusion barrier layer 66 is formed by the chemical vapor deposition method to have a thickness less than 100 Å, the first diffusion barrier layer 66 may have a non-uniform thickness and the diffusion-preventing effectiveness is reduced. Furthermore, when a thickness of the first diffusion barrier layer 66 is greater than 1000 Å, the entire thickness of the first barrier coating layer 60 is increased. Therefore, the thickness of the diffusion barrier layer 66 may be in a range of 100 Å to 1000 Å through the chemical vapor method.

A flexible layer 62, a second diffusion barrier layer 64, and a hydrophobic layer 68 formed on the first diffusion barrier layer 66 is substantially identical to a first barrier coating layer 60, according to a first exemplary embodiment.

Selectively, a second barrier coating layer 70 may be disposed on a bottom surface of the nozzle plate 40. The second barrier coating layer 70 may have a structure in which at least a hydrophobic layer 68, which is the top layer of the first barrier coating layer 60, is removed. For example, the second barrier coating layer 70 does not include SAM. For example, according to FIG. 7B, the second barrier coating layer 70 includes a first diffusion barrier layer 66, a flexible layer 62, and a second diffusion barrier layer 64 that are stacked.

A method of manufacturing an inkjet print head according to the third exemplary is embodiment will be described.

A first mask pattern is formed on a connecting electrode 52b of a print head assembly 54. The first mask pattern is provided to prevent formation of a first barrier coating layer 60 on the connecting electrode 52b.

An inorganic layer is formed by an atomic layer deposition method to form a first diffusion barrier layer 66. For example, the first diffusion barrier layer 66 may include a silicon oxide. The first diffusion barrier layer 66 may be formed at a low temperature less than 100° C. The first diffusion barrier layer 66 may have a thickness in a range of 10 Å to 1000 Å.

After the above, a process which is substantially identical with step S14 to step S22 described in FIG. 5 is used to manufacture an inkjet print head including first and second barrier coating layers 60, 70, as illustrated in FIG. 7A and FIG. 7B.

Figure 8A:
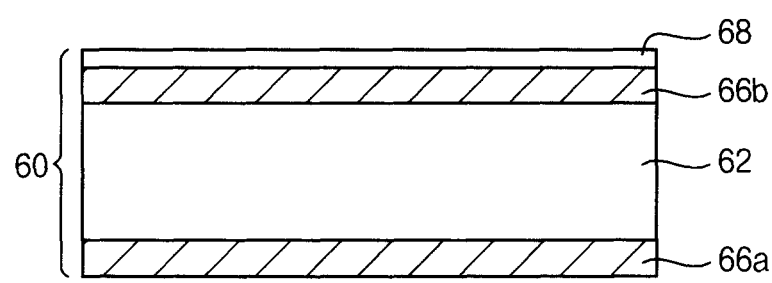
FIG. 8A is a cross-sectional view illustrating a layered structure of a first barrier coating layer of an inkjet print head according to a fourth exemplary embodiment of the present invention.
Figure 8B:
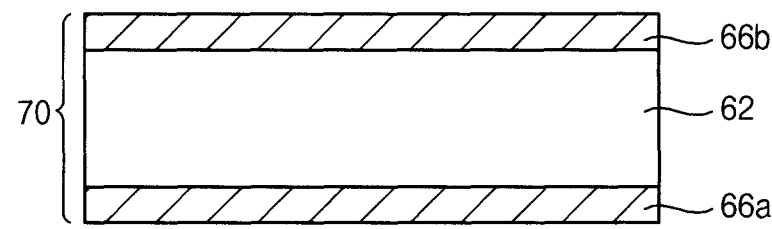
FIG. 8B is a cross-sectional view illustrating a layered structure of a second barrier coating layer of an inkjet print head according to a fourth exemplary embodiment of the present invention.

FIG. 8A is a cross-sectional view illustrating a layered structure of a first barrier coating layer 66 of an inkjet print head according to a fourth exemplary embodiment of the present invention. FIG. 8B is a cross-sectional view illustrating a layered structure of a second barrier coating layer 70 of an inkjet print head according to a fourth exemplary embodiment of the present invention.

According to FIG. 8A, a first barrier coating layer 60 includes a first diffusion barrier layer 66a, a flexible layer 62, a second diffusion barrier layer 66b, and a hydrophobic layer 68, and the first diffusion barrier layer 66a, the flexible layer 62, the second diffusion barrier layer 66b, and the hydrophobic layer 68 may be stacked.

The first diffusion barrier layer 66a and the second diffusion barrier layer 66b may each include an inorganic layer formed through a chemical vapor deposition method. For example, the first and second diffusion barrier layers 66a and 66b are substantially identical with is a first diffusion barrier layer 66 according to the third exemplary embodiment. For example, the first and second diffusion barrier layers 66a and 66b may include a silicon oxide formed through a chemical vapor deposition method. The thickness of each of the first and second diffusion barrier layers 66a and 66b may be in a range of 100 Å to 1000 Å.

According to the above, the first and second diffusion barrier layers 66a, 66b, each including an inorganic layer, are connected to a flexible layer 62, including an organic layer, to form a multiple layer which has an inorganic layer/organic layer/inorganic layered structure. Therefore, the flexible property of the entire first barrier coating layer 60 may be further improved.

The flexible layer 62 may be substantially identical with a flexible layer 62 according to a first exemplary embodiment. The flexible layer 62 may include an organic layer, for example, the parylene. Furthermore, the flexible layer 62 may have a thickness in a range of 0.1 μm to 10 μm.

The hydrophobic layer 68 may be substantially identical with a hydrophobic layer 68 according to FIG. 1. For example, the hydrophobic layer 68 may include SAM, and the hydrophobic layer 68 may be formed by a vapor phase deposition method or a liquid phase deposition method. The SAM may have a thickness less than 100 Å.

Selectively, a second barrier coating layer 70 may be disposed on a bottom surface of the nozzle plate 40. The second barrier coating layer 70 may have a structure at least a hydrophobic layer 68, which is the top layer of the first barrier coating layer 60, being removed. For example, according to FIG. 8B, the second barrier coating layer 70 includes a first diffusion barrier layer 66a, a flexible layer 62, and a second diffusion barrier layer 66b that are stacked.

A method of manufacturing an inkjet print head according to the fourth exemplary is embodiment will be described.

A first mask pattern is formed on a connecting electrode 52b of a print head assembly 54. The first mask pattern is provided to prevent forming a first barrier coating layer 60 on the connecting electrode 52b.

A first diffusion barrier layer 66a including an inorganic layer, a flexible layer 62 including an organic layer, and a second diffusion barrier layer 66b including an inorganic layer, are sequentially formed on the print head assembly 54. The first and second diffusion barrier layers 60, 70 are formed through a chemical vapor deposition method.

After the above, a process which is substantially identical with step S18 to step S22 described in FIG. 5 is used to manufacture an inkjet print head including first and second barrier coating layers 60, 70, as illustrated in FIG. 8A and FIG. 8B.

Figure 9A:
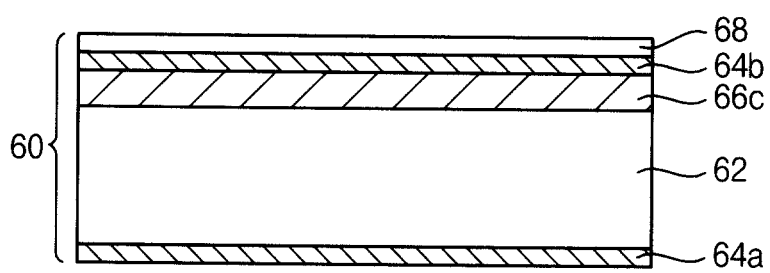
FIG. 9A is a cross-sectional view illustrating a layered structure of a first barrier coating layer of an inkjet print head according to a fifth exemplary embodiment of the present invention.
Figure 9B:
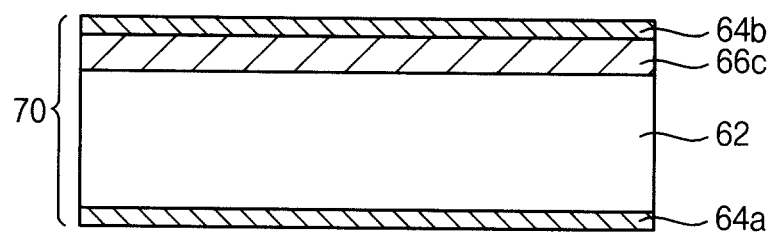
FIG. 9B is a cross-sectional view illustrating a layered structure of a second barrier coating layer of an inkjet print head according to a fifth exemplary embodiment of the is present invention.

FIG. 9A is a cross-sectional view illustrating a layered structure of a first barrier coating layer 60 of an inkjet print head according to a fifth exemplary embodiment of the present invention. FIG. 9B is a cross-sectional view illustrating a layered structure of a second barrier coating layer 70 of an inkjet print head according to a fifth exemplary embodiment of the present invention.

According to FIG. 9A, a first diffusion barrier layer 64a, a flexible layer 62, a second diffusion barrier layer 64b, a third diffusion barrier layer 66c, and a hydrophobic layer 68 are stacked to form a barrier coating layer 60.

Each of the second and third diffusion barrier layers 64b, 66c may include different materials used in different deposition methods.

The first and second diffusion barrier layer 64a, 64b may be substantially identical with the diffusion barrier layer 64 according to a first exemplary embodiment. For example, the first and second diffusion barrier layers 64a, 64b may include an inorganic layer formed through an atomic layer deposition method. The first and second diffusion barrier layer 64a, 64b may include a metal oxide. Examples of the metal oxide include an aluminum oxide, a hafnium oxide, an aluminum silicon oxide, a hafnium silicon oxide, and the like. The metal oxide may have a thickness greater than 10 Å and less than 500 Å.

The third diffusion barrier layer 66c may be substantially identical with a first diffusion barrier layer 66 according to a third exemplary embodiment. For example, the third diffusion barrier layer 66c may include an inorganic layer formed through a chemical vapor deposition method. For example, the third diffusion barrier layer 66c may include a silicon oxide formed through a chemical vapor deposition method. A thickness of the third diffusion barrier layer may be in a range of 100 Å to 1000 Å.

According to the above, the third diffusion barrier layer 66c including an inorganic layer is connected to a flexible layer 62 including an organic layer to be a multiple layer which has an inorganic layer/organic layer/inorganic layered structure. Therefore, the flexible property of the entire first barrier coating layer 60 may be further improved.

The flexible layer 62 may be substantially identical with a flexible layer 62 according to a first exemplary embodiment. The flexible layer 62 may include an organic layer, for example, the parylene. Furthermore, the flexible layer 62 may have a thickness in a range of 0.1 μm to 10 μm.

The hydrophobic layer 68 may be substantially identical with a hydrophobic layer 68 according to FIG. 1. For example, the hydrophobic layer 68 may include SAM, and the hydrophobic layer 68 may be formed through a vapor phase deposition method or a liquid phase deposition method. The SAM may have a thickness less than 100 Å.

Selectively, a second barrier coating layer 70 may be disposed on a bottom surface of the nozzle plate 40. The second barrier coating layer 70 may have a structure in which at least a hydrophobic layer 68, which is the top layer of the first barrier coating layer 60, is removed. For example, according to FIG. 9B, the second barrier coating layer 70 includes a first diffusion barrier layer 64a, a flexible layer 62, and a second diffusion barrier layer 64b that are stacked.

A method of manufacturing an inkjet print head according to the fifth exemplary embodiment will be described.

A first mask pattern is formed on a connecting electrode 52b of a print head assembly 54. The first mask pattern is provided to prevent forming a first barrier coating layer 60 on the connecting electrode 52b.

A first diffusion barrier layer 64a including an inorganic layer formed through an atomic layer deposition method, a flexible layer 62 including an organic layer, a third diffusion barrier layer 66c including an inorganic layer formed through a chemical vapor deposition method, and a second diffusion barrier layer 64b are sequentially formed on the print head assembly 54.

After the above, a process which is substantially identical with step S18 to step S22 described in FIG. 5 is performed to manufacture an inkjet print head including the first and second barrier coating layers 60 and 70 illustrated in FIG. 9A and FIG. 9B.

Figure 10A:
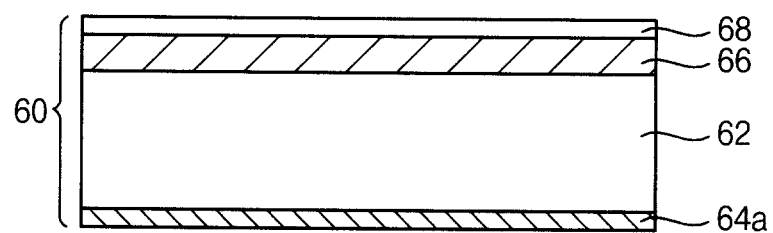
FIG. 10A is a cross-sectional view illustrating a layered structure of a first barrier coating layer of an inkjet print head according to a sixth exemplary embodiment of the present invention.
Figure 10B:
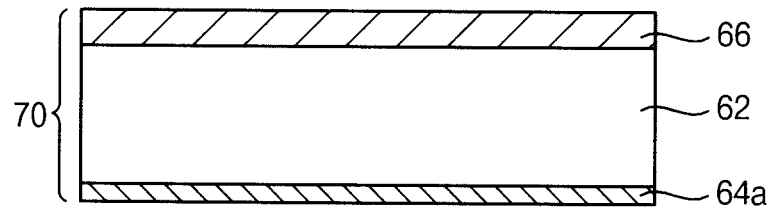
FIG. 10B is a cross-sectional view illustrating a layered structure of a second barrier coating layer of an inkjet print head according to a sixth exemplary embodiment of the present invention.

FIG. 10A is a cross-sectional view illustrating a layered structure of a first barrier coating layer of an inkjet print head according to a sixth exemplary embodiment of the present invention. FIG. 10B is a cross-sectional view illustrating a layered structure of a second barrier coating layer of an inkjet print head according to a sixth exemplary embodiment of the present is invention.

According to FIG. 10A, a first diffusion barrier layer 64a, a flexible layer 62, a second diffusion barrier layer 66, and a hydrophobic layer 68 are stacked to form a first barrier coating layer 60.

Each of the first and second diffusion barrier layers 64a and 66 may include different materials used in different deposition methods.

The first diffusion barrier layer 64a may be substantially identical with a diffusion barrier layer 64 according to a first exemplary embodiment. For example, the first diffusion barrier layer 64a may include an inorganic layer formed through an atomic layer deposition method. The first diffusion barrier layer 64a may include a metal oxide. Examples of the metal oxide include an aluminum oxide, a hafnium oxide, an aluminum silicon oxide, a hafnium silicon oxide, and the like. The metal oxide may have a thickness greater than 10 Å and less than 500 Å.

The second diffusion barrier layer 66 may be substantially identical with a first diffusion barrier layer 66 according to a third exemplary embodiment. For example, the second diffusion barrier layer 66 may include an inorganic layer formed through a chemical vapor deposition method. For example, the second diffusion barrier layer 66 may include a silicon oxide formed through a chemical vapor deposition method. A thickness of the second diffusion barrier layer may be in a range of 100 Å to 1000 Å.

According to the above, the second diffusion barrier layer 66 including an inorganic material is connected to a flexible layer 62 including an organic layer to be a multiple layer which has an inorganic layer/organic layer/inorganic layered structure. Therefore, the flexible property of an entire first barrier coating layer 60 may be further improved.

The flexible layer 62 may be substantially identical with a flexible layer 62 is according to a first exemplary embodiment. The flexible layer 62 may include an organic layer, for example, the parylene. Furthermore, the flexible layer 62 may have a thickness in a range of 0.1 μm to 10 μm.

The hydrophobic layer 68 may be substantially identical with a hydrophobic layer 68 according to the first exemplary embodiment. For example, the hydrophobic layer 68 may include SAM, and the hydrophobic layer may be formed through a vapor phase deposition method or a liquid phase deposition method. The SAM may have a thickness less than 100 Å.

Selectively, a second barrier coating layer 70 may be disposed on a bottom surface of the nozzle plate 40. The second barrier coating layer 70 may have a structure in which at least a hydrophobic layer 68, which is the top layer of the barrier coating layer 60, is removed. For example, according to FIG. 10B, the second barrier coating layer 70 includes a first diffusion barrier layer 64a, a flexible layer 62, and a second diffusion barrier layer 66 that are stacked.

A method of manufacturing an inkjet print head according to the sixth exemplary embodiment will be described.

A first mask pattern is formed on a connecting electrode 52b of a print head assembly 54. The first mask pattern is provided to prevent forming a first barrier coating layer 60 on the connecting electrode 52b.

A first diffusion barrier layer 64a including an inorganic layer formed through an atomic layer deposition method, a flexible layer 62 including an organic layer, and a second diffusion barrier layer 66 including an inorganic layer formed through a chemical vapor deposition method are sequentially formed on the print head assembly 54.

After the above, a process which is substantially identical with step S18 to step S22 described in FIG. 5 is used to manufacture an inkjet print head including first and second barrier coating layers 60 and 70 illustrated in FIG. 10A and FIG. 10B.

Figure 11A:
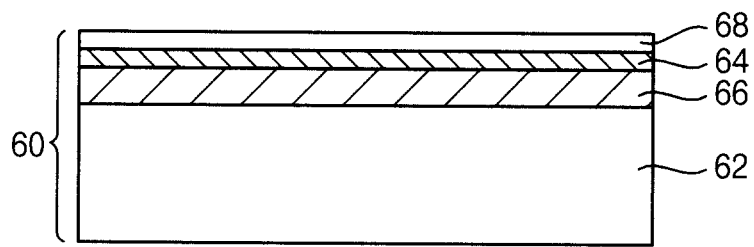
FIG. 11A is a cross-sectional view illustrating a layered structure of a first barrier coating layer of an inkjet print head according to a seventh exemplary embodiment of the present invention.
Figure 11B:
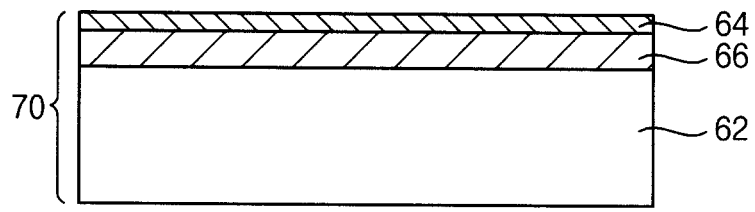
FIG. 11B is a cross-sectional view illustrating a layered structure of a second barrier coating layer of an inkjet print head according to a seventh exemplary embodiment of the present invention.

FIG. 11A is a cross-sectional view illustrating a layered structure of a first barrier coating layer 60 of an inkjet print head according to a seventh exemplary embodiment of the present invention. FIG. 11B is a cross-sectional view illustrating a layered structure of a second barrier coating layer 70 of an inkjet print head according to a seventh exemplary embodiment of the present invention.

According to FIG. 11A, a flexible layer 62, a first diffusion barrier layer 66, a second diffusion barrier layer 64, and a hydrophobic layer 68 are stacked to form a barrier coating layer 60.

Each of the first and the second diffusion barrier layer 66 and 64 may include different materials used in different deposition methods.

The first diffusion barrier layer 66 may be substantially identical with a diffusion barrier layer 64 according to a first exemplary embodiment. For example, the first diffusion barrier layer 66 may include an inorganic layer formed through a chemical vapor deposition method. The first diffusion barrier layer 66 may include a silicon oxide. A thickness of the first diffusion barrier layer may be in a range of 10 Å to 1000 Å.

According to the above, the first diffusion barrier layer 66 including an inorganic material is connected to a flexible layer 62 to be a multiple layer which has an inorganic layer/ organic layered structure. Therefore, the flexible property of an entire first barrier coating layer 60 may be further improved.

The second diffusion barrier layer 64 may be substantially identical with a diffusion barrier layer 64 according to a first exemplary embodiment. For example, the second diffusion barrier layer 64 may include a metal oxide formed through an atomic layer deposition method. Examples of the metal oxide may include an aluminum oxide, a hafnium oxide, an aluminum silicon oxide, a hafnium silicon oxide, and the like. A thickness of the second diffusion barrier layer may be in a range of 100 Å to 1000 Å.

The flexible layer 62 may be substantially identical with a flexible layer 62 according to a first exemplary embodiment. The flexible layer 62 may include an organic layer, for example, the parylene. Furthermore, the flexible layer 62 may have a thickness in a range of 0.1 μm to 10 μm.

The hydrophobic layer 68 may be substantially identical with a hydrophobic layer 68 according to the first exemplary embodiment. For example, the hydrophobic layer 68 may include SAM, and the hydrophobic layer may be formed through a vapor phase deposition method or a liquid phase deposition method. The SAM may have a thickness less than 100 Å.

Selectively, a second barrier coating layer 70 may be disposed on a bottom surface of the nozzle plate 40. The second barrier coating layer 70 may have a structure in which at least a hydrophobic layer 68, which is the top layer of the barrier coating layer 60, is removed. For example, according to FIG. 12B, the second barrier coating layer 70 includes a first diffusion barrier layer 64, a flexible layer 62 and a second diffusion barrier layer 66 that are stacked.

A method of manufacturing an inkjet print head according to the seventh exemplary embodiment will be described.

A first mask pattern is formed on a connecting electrode 52b of a print head assembly 54. The first mask pattern is provided to prevent forming a first barrier coating layer 60 on the connecting electrode 52b.

A flexible layer 62 including an organic layer, a first diffusion barrier layer 66 including an inorganic layer formed through a chemical vapor deposition method, and a first is diffusion barrier layer 64 including an inorganic layer formed through an atomic layer deposition method are sequentially formed on the print head assembly 54.

After the above, a process which is substantially identical with step S18 to step S22 described in FIG. 5 is used to manufacture an inkjet print head including first and second barrier coating layers 60 and 70 illustrated in FIG. 11A and FIG. 11B.

Figure 12A:
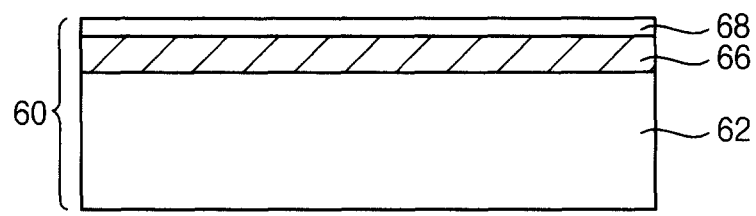
FIG. 12A is a cross-sectional view illustrating a layered structure of a first barrier coating layer of an inkjet print head according to a eighth exemplary embodiment of the present invention.
Figure 12B:
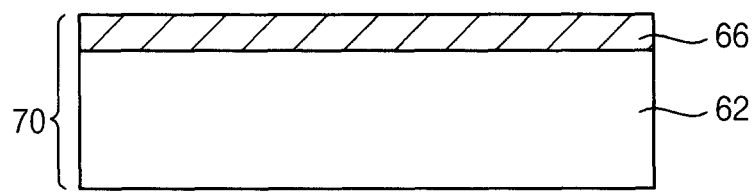
FIG. 12B is a cross-sectional view illustrating a layered structure of a second barrier coating layer of an inkjet print head according to a eighth exemplary embodiment of the present invention.

FIG. 12A is a cross-sectional view illustrating a layered structure of a first barrier coating layer 60 of an inkjet print head according to an eighth exemplary embodiment of the present invention. FIG. 12B is a cross-sectional view illustrating a layered structure of a second barrier coating layer 70 of an inkjet print head according to an eighth exemplary embodiment of the present invention.

According to FIG. 12A, a flexible layer 62, a diffusion barrier layer 66, and a hydrophobic layer 68 are stacked to form a first barrier coating layer 60.

The diffusion barrier layer 66 may be substantially identical with a first diffusion barrier layer 66 according to a third exemplary embodiment. For example, the diffusion barrier layer 66 may include an inorganic layer formed through a chemical vapor deposition method. The diffusion barrier layer 66 may include a silicon oxide. A thickness of the first diffusion barrier layer may be in a range of 10 Å to 1000 Å.

According to the above, the diffusion barrier layer 66 including an inorganic layer is connected to a flexible layer 62 including an organic layer to be a multiple layer which has an inorganic layer/organic layered structure. Therefore, the flexible property of the entire first barrier coating layer 60 may be further improved.

The flexible layer 62 may be substantially identical with a flexible layer 62 according to a first exemplary embodiment. The flexible layer 62 may include an organic layer, is for example, the parylene. Furthermore, the flexible layer 62 may have a thickness in a range of 0.1 μm to 10 μm.

The hydrophobic layer 68 may be substantially identical with a hydrophobic layer 68 according to the first exemplary embodiment. For example, the hydrophobic layer 68 may include SAM, and the hydrophobic layer may be formed through a vapor phase deposition method or a liquid phase deposition method. The SAM may have a thickness less than 100 Å.

Selectively, a second barrier coating layer 70 may be disposed on a bottom surface of the nozzle plate 40. The second barrier coating layer 70 may have a structure in which at least a hydrophobic layer 68, which is the top layer of the first barrier coating layer 60, is removed. For example, according to FIG. 12B, the second barrier coating layer 70 includes a flexible layer 62 and a diffusion barrier layer 66 that are stacked.

A method of manufacturing an inkjet print head according to the eighth exemplary embodiment will be described.

A first mask pattern is formed on a connecting electrode 52b of a print head assembly 54. The first mask pattern is provided to prevent forming a first barrier coating layer 60 on the connecting electrode 52b.

A flexible layer 62 including an organic layer and a diffusion barrier layer 66 including an inorganic layer formed through a chemical vapor deposition method are sequentially formed on the print head assembly 54.

After the above, a process which is substantially identical with step S18 to step S22 described in FIG. 5 is used to manufacture an inkjet print head including first and second barrier coating layers 60, 70, as illustrated in FIG. 12A and FIG. 12B.

Figure 13A:
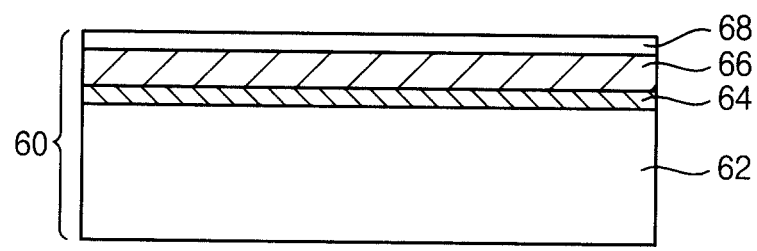
FIG. 13A is a cross-sectional view illustrating a layered structure of a first barrier coating layer of an inkjet print head according to a ninth exemplary embodiment of the present invention.
Figure 13B:
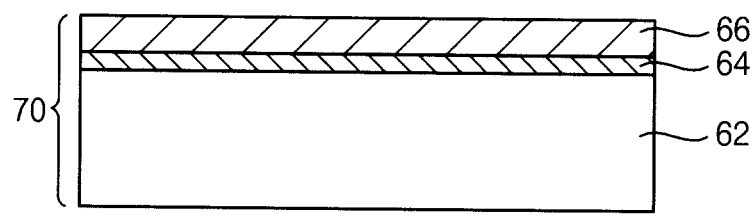
FIG. 13B is a cross-sectional view illustrating a layered structure of a second barrier coating layer of an inkjet print head according to a ninth exemplary embodiment of the present invention.

FIG. 13A is a cross-sectional view illustrating a layered structure of a first barrier is coating layer 60 of an inkjet print head according to a ninth exemplary embodiment of the present invention. FIG. 13B is a cross-sectional view illustrating a layered structure of a second barrier coating layer 70 of an inkjet print head according to a ninth exemplary embodiment of the present invention.

According to FIG. 13A, a flexible layer 62, a first diffusion barrier layer 64, a second diffusion barrier layer 66, and a hydrophobic layer 68 are stacked to form a first barrier coating layer 60.

Each of the first and the second diffusion barrier layers 64, 66 may include different materials used in different deposition methods.

The first diffusion barrier layer 64 may be substantially identical with a diffusion barrier layer 64 according to a first exemplary embodiment. For example, the first diffusion barrier layer 64 may include an inorganic layer formed through an atomic layer deposition method. The first diffusion barrier layer 64 may include a metal oxide. Examples of the metal oxide may include an aluminum oxide, a hafnium oxide, an aluminum silicon oxide, a hafnium silicon oxide and the like. A thickness of the metal oxide may be greater than 10 Å and less than 500 Å.

The second diffusion barrier layer 66 may be substantially identical with a first diffusion barrier layer 66 according to a third exemplary embodiment. For example, the second diffusion barrier layer 66 may include an inorganic layer formed through a chemical vapor deposition method. The second diffusion barrier layer 66 may include a silicone oxide. A thickness of the silicon oxide may be greater than 10 Å and less than 500 Å

The flexible layer 62 may be substantially identical with a flexible layer 62 according to a first exemplary embodiment. The flexible layer 62 may include an organic layer, is for example, the parylene. Furthermore, the flexible layer 62 may have a thickness in a range of 0.1 μm to 10 μm.

The flexible layer 62 includes an organic layer and inorganic layer that are stacked as the first diffusion barrier layer 64 is disposed on the flexible layer 62.

The hydrophobic layer 68 may be substantially identical with a hydrophobic layer 68 according to the first exemplary embodiment. For example, the hydrophobic layer 68 may include SAM, and the hydrophobic layer may be formed through a vapor phase deposition method or a liquid phase deposition method. The SAM may have a thickness of thinner than 100 Å.

Selectively, a second barrier coating layer 70 may be disposed on a bottom surface of the nozzle plate 40. The second barrier coating layer 70 may have a structure in which at least a hydrophobic layer 68, which is the top layer of the barrier coating layer 60, is removed. For example, according to FIG. 13B, the second barrier coating layer 70 includes a flexible layer 62, a first diffusion barrier layer 64, and a second diffusion barrier layer 66 that are stacked.

A method of manufacturing an inkjet print head according to the ninth exemplary embodiment will be described.

A first mask pattern is formed on a connecting electrode 52b of a print head assembly 54. The first mask pattern is provided to prevent forming a first barrier coating layer 60 on the connecting electrode 52b.

A flexible layer 62 including an organic layer, a first diffusion barrier layer 64 including an inorganic layer formed through an atomic layer deposition method, and a first diffusion barrier layer 66 including an inorganic layer formed through a chemical vapor deposition method are sequentially formed on the print head assembly 54.

After the above, a process which is substantially identical with step S18 to step S22 described in FIG. 5 is used to manufacture an inkjet print head including first and second barrier coating layers 60 and 70, as illustrated in FIG. 13A and FIG. 13B.

According to the above, an inkjet print head having high durability and a reduction in contamination is provided.

The foregoing is illustrative of the present invention and is not to be construed as limiting thereof. Although hydrophobic exemplary embodiments of the present invention have been described, it will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An inkjet print head, comprising:
   a jet assembly comprising a nozzle plate, the nozzle plate comprising an ink transferring path and a jet, the ink transferring path being disposed in the nozzle plate and the jet being disposed on a bottom surface of the nozzle plate, the jet being configured to transfer ink through the jet;
   a printed circuit substrate connected to the jet assembly, the printed circuit substrate comprising an integrated circuit and a connection electrode; and
   a barrier coating layer formed on the jet assembly and the printed circuit substrate and covering a surface of the printed circuit substrate and an inner surface and an outer surface of the jet assembly except for a bottom surface of the nozzle plate and a surface of the connection electrode, the barrier coating layer comprising a flexible layer, a diffusion barrier layer, and a hydrophobic layer that are sequentially stacked.

2. The inkjet print head of claim 1, wherein the flexible layer comprises an organic layer.

3. The inkjet print head of claim 2, wherein the flexible layer comprises parylene.

4. The inkjet print head of claim 1, wherein the flexible layer is a thickest layer of the layers in the barrier coating layer.

5. The inkjet print head of claim 1, wherein a thickness of the flexible layer is in a range of 0.1 μm to 10 μm.

6. The inkjet print head of claim 1, wherein the diffusion barrier layer comprises an inorganic layer.

7. The inkjet print head of claim 6, wherein the diffusion barrier layer comprises a silicon oxide.

8. The inkjet print head of claim 6, wherein the diffusion barrier layer comprises a metal oxide.

9. The inkjet print head of claim 1, wherein the diffusion barrier layer comprises a plurality of layers, wherein each layer is formed of a material that is different from a material in another layer.

10. The inkjet print head of claim 1, wherein the hydrophobic layer comprises a self assembly monolayer (SAM).

11. The inkjet print head of claim 1, further comprising at least one additional diffusion barrier layer disposed on a bottom surface of the flexible layer.

12. The inkjet print head of claim 11, wherein the additional diffusion barrier layer comprises an inorganic layer.

13. The inkjet print head of claim 1, wherein the barrier coating layer on the jet assembly and on the printed circuit substrate are disposed on the outer surface of the jet assembly, an inner surface of the ink transferring path, an inner surface of the jet, and the surface of the printed circuit substrate on which the integrated circuit is formed.

14. The inkjet print head of claim 1, wherein the barrier coating layer in the jet assembly is disposed on an entire surface of the jet assembly.

15. The inkjet print head of claim 1, further comprising an additional barrier coating layer disposed on the bottom surface of the nozzle plate.

16. The inkjet print head of claim 15, wherein the additional barrier coating layer comprises a layered structure in which a hydrophobic layer is not disposed on top of the additional barrier coating layer.

17. A method of manufacturing a inkjet print head, the method comprising:
   forming a print head assembly, the print head assembly being connected to a jet assembly and a printed circuit substrate;
   forming a first mask pattern on a connection electrode of the printed circuit substrate;
   forming a flexible layer on an inner surface and an outer surface of the print head assembly having the first mask pattern;
   forming a diffusion barrier layer on the flexible layer;
   forming a second mask pattern on a bottom surface of a nozzle plate of the jet assembly;
   forming a hydrophobic layer on the diffusion barrier layer and the second mask pattern; and
   removing the first and second mask patterns to form a barrier coating layer on the inner and outer surfaces of the print head assembly, the barrier coating layer comprising the flexible layer, the diffusion barrier layer, and the hydrophobic layer.

18. The method of claim 17, wherein the flexible layer is formed by depositing an organic layer.

19. The method of claim 17, wherein the diffusion barrier layer is formed by depositing an inorganic layer by chemical vapor deposition method or atomic layer deposition.

20. The method of claim 17, wherein the hydrophobic layer is formed by depositing a self assembly monolayer.

21. The method of claim 17, wherein the flexible layer, the diffusion barrier layer, and the hydrophobic layer are formed at a temperature in a range of 10° C. to 100° C.

22. An inkjet print head, comprising:
- a jet assembly comprising a nozzle plate, the nozzle plate comprising an ink transferring path and a jet, the ink transferring path being disposed in the nozzle plate and the jet being disposed on a bottom surface of the nozzle plate, the jet being configured to transfer ink through the jet;
- a printed circuit substrate connected to the jet assembly, the printed circuit substrate comprising an integrated circuit and a connection electrode; and
- a barrier coating layer formed on the jet assembly and the printed circuit substrate and covering a surface of the printed circuit substrate and an inner surface and an outer surface of the jet assembly except for a bottom surface of the nozzle plate and a surface of the connection electrode.

23. The inkjet print head of claim 22, wherein the barrier coating layer comprises a flexible layer, a diffusion barrier layer, and a hydrophobic layer that are sequentially stacked.

* * * * *